United States Patent
Vinther et al.

(10) Patent No.: US 9,347,982 B1
(45) Date of Patent: May 24, 2016

(54) CIRCUIT BOARD PROBE FIXTURE

(71) Applicant: Ardent Concepts, Inc., Seabrook, NH (US)

(72) Inventors: Gordon A Vinther, Seabrook, NH (US); Sergio Diaz, Cambridge, MA (US)

(73) Assignee: Ardent Concepts, Inc., Seabrook, NH (US)

( * ) Notice: Subject to any disclaimer, the term of this patent is extended or adjusted under 35 U.S.C. 154(b) by 0 days.

(21) Appl. No.: 14/726,541

(22) Filed: May 31, 2015

Related U.S. Application Data

(60) Provisional application No. 62/005,162, filed on May 30, 2014.

(51) Int. Cl.
  *G01R 31/20* (2006.01)
  *G01R 31/28* (2006.01)
  *G01R 1/04* (2006.01)

(52) U.S. Cl.
  CPC .......... *G01R 31/2808* (2013.01); *G01R 1/0416* (2013.01); *G01R 1/0433* (2013.01)

(58) Field of Classification Search
  CPC ........... G01R 31/2887; G01R 31/2884; G01R 31/2863; G01R 1/0425; G01R 1/0483; H01L 21/683
  USPC ......................... 324/750.25, 500, 537, 750.16
  See application file for complete search history.

(56) References Cited

U.S. PATENT DOCUMENTS

| | | | | |
|---|---|---|---|---|
| 4,322,682 A | * | 3/1982 | Schadwill | G01R 1/07328 324/750.25 |
| 4,912,400 A | * | 3/1990 | Plante | G01R 1/07378 324/750.16 |
| 5,329,692 A | * | 7/1994 | Kashiwagi | H05K 13/0452 29/740 |
| 5,506,510 A | * | 4/1996 | Blumenau | G01R 1/07385 324/149 |

* cited by examiner

*Primary Examiner* — Son Le
*Assistant Examiner* — Giovanni Astacio-Oquendo
(74) *Attorney, Agent, or Firm* — Altman & Martin; Steven K Martin

(57) ABSTRACT

A fixture for probing circuit boards and microcircuits. A guide plate provides indexing for positioning a probe assembly in one or two dimensions. The guide plate has two opposed mounting sides connected by one or two indexing sides and is mounted to the test unit by screws. The indexing sides and, optionally, the mounting sides have column mounting holes and column markings. A bridge mounts to the indexing sides with its column pointer aligned with the desired column marking. The bridge has row mounting holes and row markings. The probe assembly mounts to the bridge with its row pointer aligned with the desired row marking. Optionally, the bridge is part of the probe assembly and without row indexing elements to be used in one dimension. The probe assembly has a terminator platform and connector plate with electrical cable assemblies extending therebetween.

14 Claims, 17 Drawing Sheets

CIRCUIT BOARD PROBE FIXTURE

STATEMENT REGARDING FEDERALLY SPONSORED RESEARCH OR DEVELOPMENT

Not Applicable.

REFERENCE TO A SEQUENCE LISTING, A TABLE, OR A COMPUTER PROGRAM LISTING COMPACT DISK APPENDIX

Not Applicable.

BACKGROUND OF THE INVENTION

1. Field of the Invention

The present invention relates to electronic testing, more particularly, to fixtures for testing circuit boards and components.

2. Description of the Related Art

Computer designers need to understand what happens to signals as they travel to and from the outside world to the processor. Along that path, the signal will pass through several feet of cable, a variety of board edge connectors, solder joints, inches of board trace, vias, and socket contacts before they finally reach the processor. All of those transitions have unwanted effects, like reflections and noise. If the designer can measure those effects, they can plan for them in the design.

These effects are measured with instrumentation like vector network analyzers and time domain reflectometers. The most widely used interface between those instruments and the board is a coplanar probe. A coplanar probe is constructed as follows. A coaxial cable is terminated on one end with flexible, conductive cantilever beams. One or more of the beams connect to the cable's ground shield and one connects to the cable's center conductor. The beams are spaced to match the cable's impedance environment. The beam end of the cable is held in an armature and the other end of the cable has a standard coaxial connector for instrumentation cables. The armature holds the beams at a shallow angle with respect to the board surface.

A large x-y-z stage is used to move the armature so the beams touch the desired spot on the board. Motion happens first along a plane just above the board surface, then the beams are lowered along the z axis with the appropriate contact force. The user can only probe a lone single-ended or differential pair signal location on the board. If a second signal location needs probing, a second probe and x-y-z stage are needed. The signal locations are small and tightly spaced, meaning the probe motion needs to be monitored under magnification. The cantilever beams have limited travel making them sensitive to disturbances in the board's z-axis position. Often, the boards need to be mounted on a special pneumatic table to dampen building vibrations or unintended bumps from the user.

All the extra hardware needed to probe even one signal location makes the overall solution large and cumbersome. In some cases, the task requires more than one person—one manning the x-y-z stage and the other guiding the motion through a microscope. Setup can take an hour or more per position. Alternative solutions that use automation are very expensive. Furthermore, even after the probe has been positioned, the user still needs to deal with how fragile they are. Bumping the board by accident can snap the beams and cause lengthy delays in the testing schedule.

BRIEF SUMMARY OF THE INVENTION

The present invention is a fixture for probing generally planar circuit boards and microcircuits with extremely fine pitch. The fixture has a number of components: an optional board stiffener, a guide plate, a bridge, and a probe assembly.

The optional board stiffener is a rigid sheet or plate that adds stiffness to the test unit.

The guide plate provides the indexing necessary to correctly position the probe assembly in one or two dimensions. The present invention contemplates that the guide plate can have many different configurations. A basic configuration has two opposed mounting sides connected by two opposed indexing sides. This configuration can be generally rectangular or the mounting sides can extend beyond the indexing sides. Another configuration has two opposed mounting sides connected by one indexing side.

The guide plate is placed on the test unit and held by removable fasteners, typically screws that fit through holes in the mounting sides of the guide plate, though holes in the test unit, and that turn into threaded holes in the board stiffener or into nuts under the test unit.

Each of the indexing sides has a line of column mounting holes, an optional line of column alignment holes parallel to the column mounting holes, and column markings. Optionally, each of the mounting sides also has a line of column mounting holes, an optional line of column alignment holes parallel to the column mounting holes, and column markings.

The bridge provides the indexing necessary to correctly position the probe assembly in the dimension orthogonal to that of the guide plate. A bridge has a line of row mounting holes, an optional line of row alignment holes parallel to the row mounting holes, row markings, a column index pointer, one or more optional column alignment pins, and column mounting holes.

The probe assembly provides the electrical signal connection to the test unit and has a base plate with a terminator platform and a connector plate connected by posts to the base plate. The base plate has one or more optional row alignment pins. External test signals and sensors connect to the test unit through a cable assembly extending from a connector at that connector plate, through a cable, to a terminator at the termination platform. The terminators are arranged on the terminator platform so that the terminator signal and ground contacts match the arrangement and pitch of the I/O grid of the test unit.

The fixture is indexed in columns and rows in the plane of the test unit. Columns are indexed by the column markings on the indexing sides and rows are indexed by the row markings on the bridge. The bridge is positioned on the guide plate for a desired column such that the column index pointer on the bridge is aligned with the desired column marking. Then the bridge is mounted with removable fasteners, typically screws inserted into the mounting holes and turned into the aligned column holes. The optional column alignment pin(s) fit into the appropriate optional column alignment holes to maintain the position of the bridge while installing the mounting screws.

The probe assembly is positioned on the guide plate for a desired row such that the row index pointer on the probe assembly is aligned with the desired row marking. Then the probe assembly is mounted with removable fasteners, typically screws inserted into the mounting holes and turned into the aligned row holes. The optional row alignment pin(s) fit into the appropriate optional row alignment holes to maintain the position of the probe assembly while installing the mounting screws.

The particular terminator corresponding to the selected column and row is shown by index markings on the terminator platform and connector plate.

Optionally, the probe assembly is designed so that the probe assembly incorporates a bridge. Optionally, the fixture is designed so that the probe assembly/bridge can be mounted directly to the guide plate.

Objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION OF THE INVENTION

Figure 1:
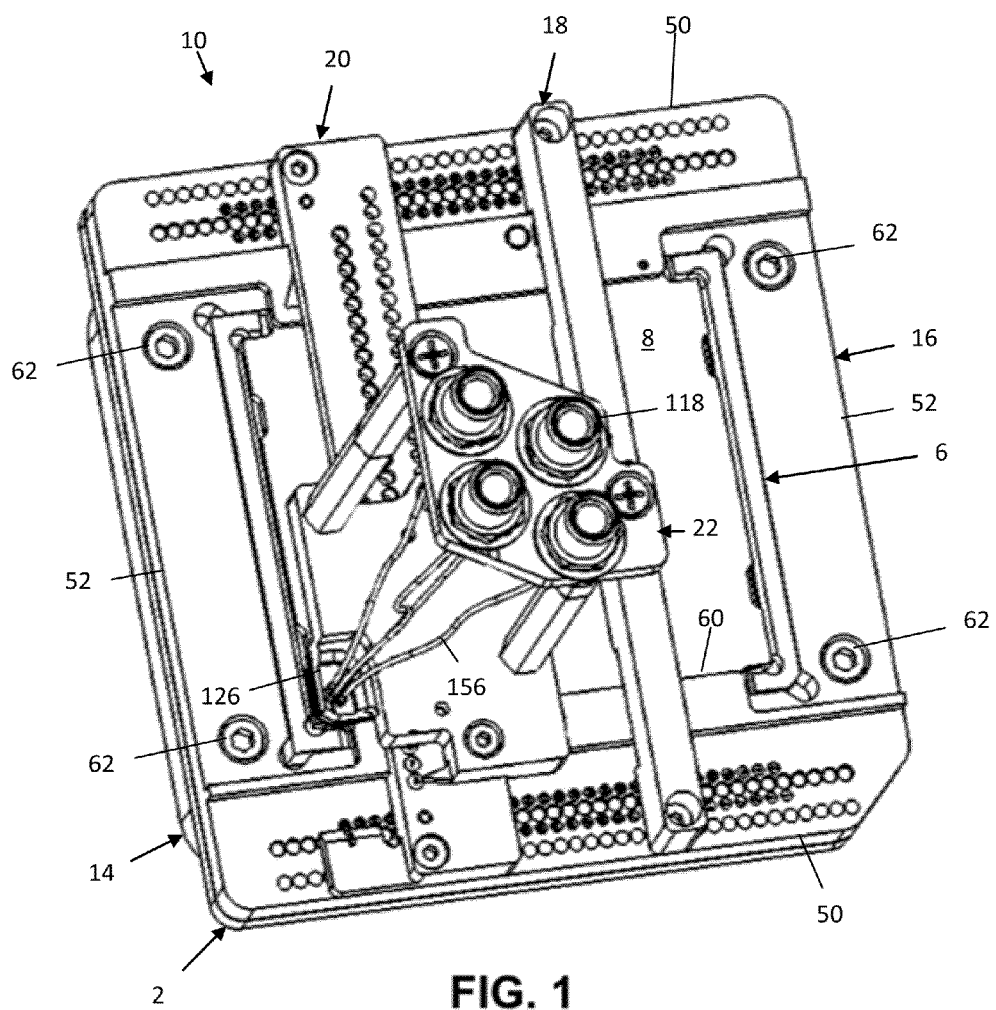
FIG. 1 is a top perspective view of the circuit board probe fixture of the present invention assembled with a test unit.

The present application hereby incorporates by reference in its entirety U.S. Provisional Patent Application No. 62/005,162, on which this application is based.

The present invention, shown in the figures, is a fixture 10 for probing circuit boards and microcircuits with extremely fine pitch. In the present specification, the device being tested using the fixture 10 is denoted as the test unit 2.

The fixture 10 of the present invention can be used with test units 2 that are generally planar with a board 4. Optionally, the test unit 2 has a socket 6 for a microcircuit. If there is a socket 6, there may also be a contact extender 8 that, in essence, raises the level of the socket contacts to facilitate probing.

Manufacturers typically arrange the inputs and outputs (I/O) of their boards and microcircuits in a two-dimensional grid to connect them to the outside world. Typically, the grid columns and rows are designated with number and letter combinations.

As shown in FIGS. 1-5, the fixture 10 has a number of components: an optional board stiffener 14, a guide plate 16, an optional retaining beam 18, a bridge 20, and a probe assembly 22.

The optional board stiffener 14 is a rigid sheet or plate that adds stiffness to the test unit 2. It may be supplied by the test unit manufacturer specifically for the test unit 2 or it may be supplied as part of the fixture 10. The board stiffener 14 is positioned under the test unit 2. In the present design, the board stiffener 14 is retained in place as described below with reference to the guide plate 16. Any other retention mechanism that does not affect the operation of the fixture 10 can be used.

Figure 7:
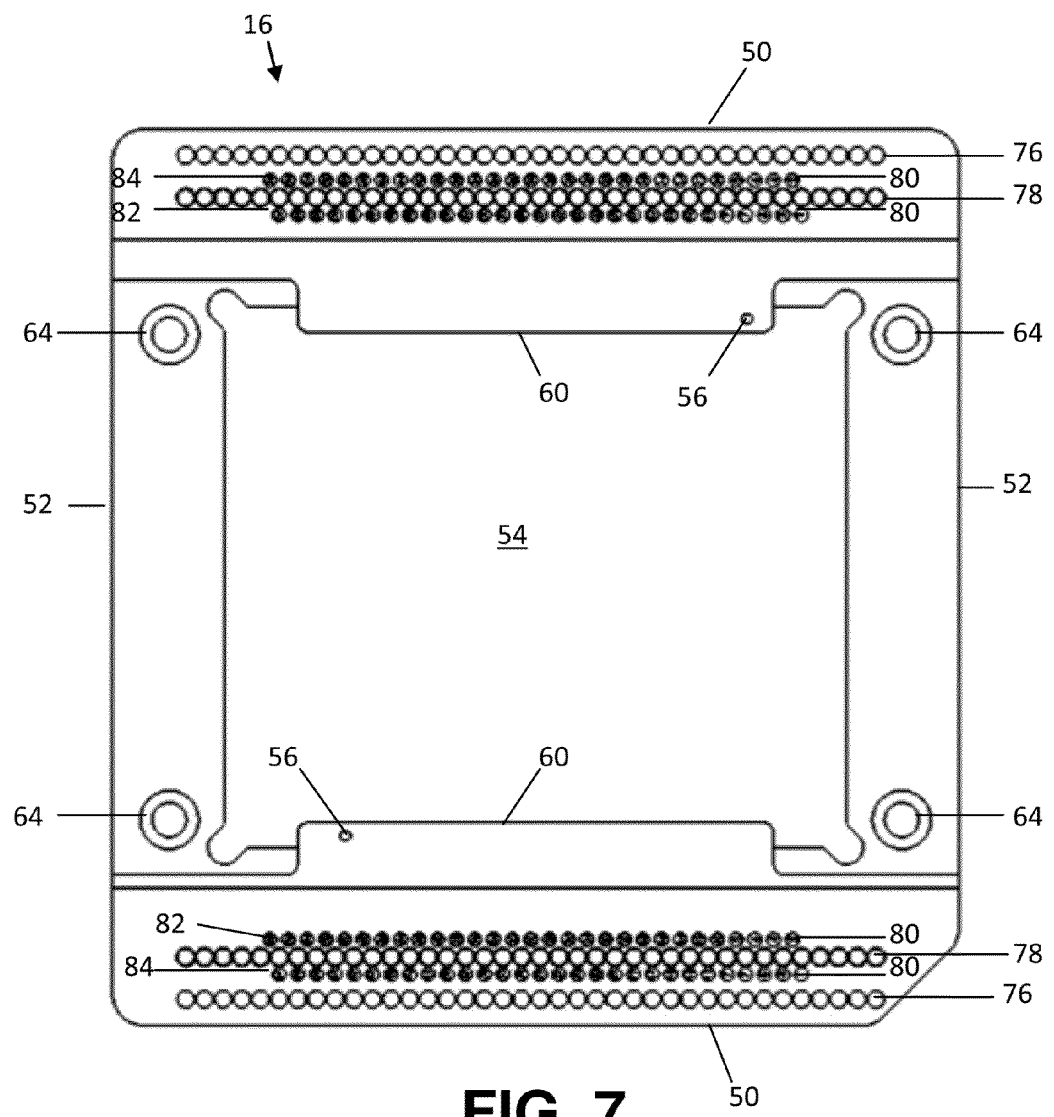
FIG. 7 is a top view of one configuration of the guide plate.

The guide plate 16, shown in FIGS. 7-10, provides the indexing necessary to correctly position the probe assembly 22 in one or two dimensions. One configuration of the guide plate 16 is shown in FIG. 7 and has a pair of opposed indexing sides 50 connected by a pair of opposed mounting sides 52. Typically, the guide plate 16 will be a parallelogram with the indexing sides 50 parallel to each other. In most cases, the guide plate 16 will be generally rectangular with the mounting sides 52 also parallel to each other.

Figure 8:
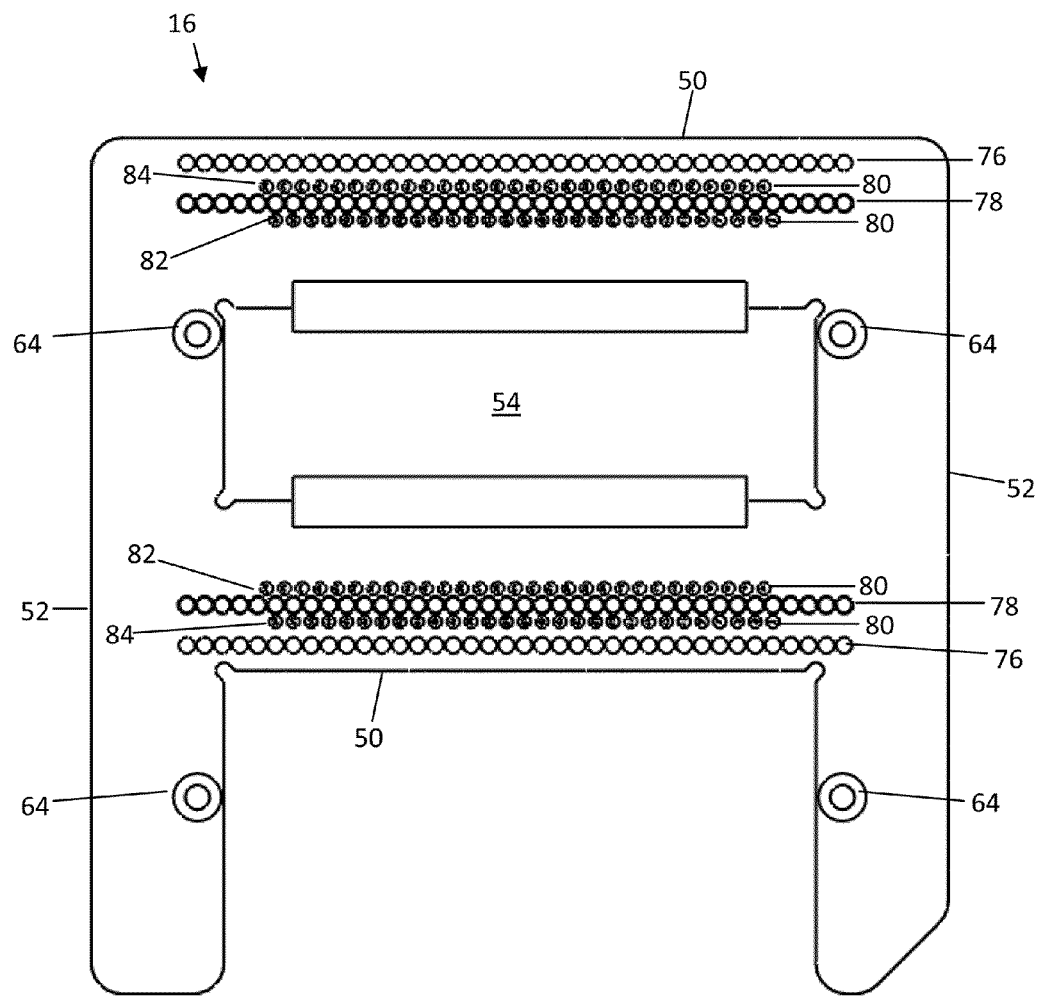
FIG. 8 is a top view of another configuration of the guide plate.

Another configuration of the guide plate 16 is shown in FIG. 8 and has a pair of opposed indexing sides 50 connected by a pair of opposed mounting sides 52. The difference from the configuration of FIG. 7 is that the mounting sides 52 extend beyond one of the indexing sides 50 for cases where the mounting holes in the test unit 2 are offset from the test points on the test unit 2. The present invention also contemplates that the mounting sides 52 can extend beyond both indexing sides 50.

Figure 9:
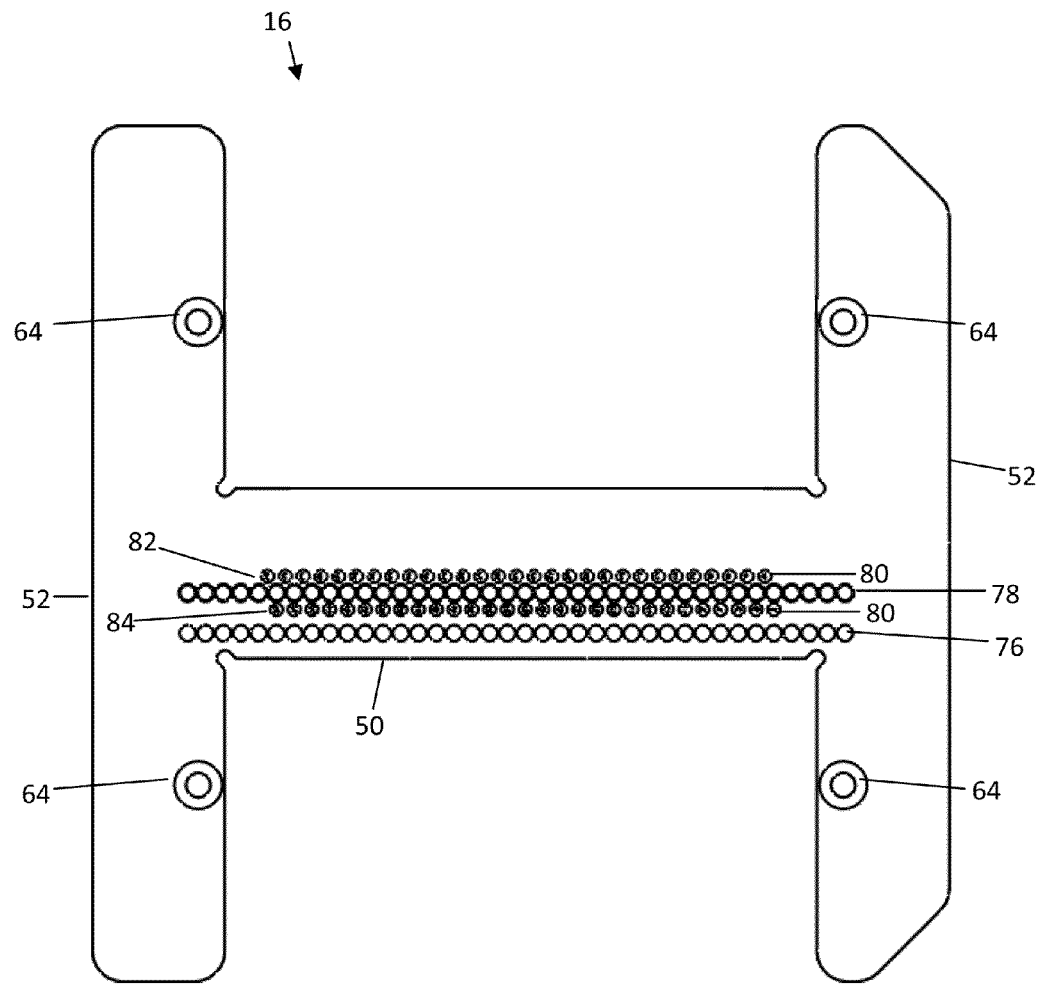
FIG. 9 is a top view of another configuration of the guide plate.

Another configuration of the guide plate 16, shown in FIG. 9, has a pair of opposed mounting sides 52 connected by a single indexing side 50.

Figure 3:
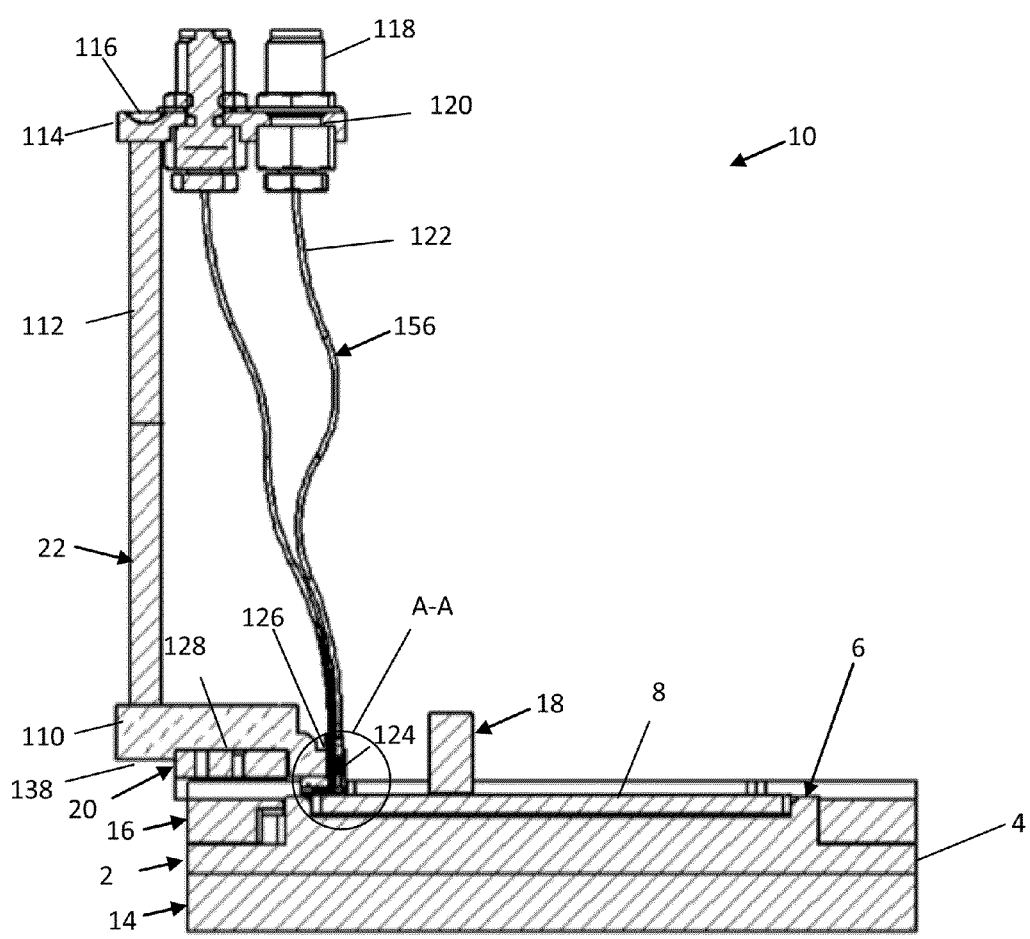
FIG. 3 is a side view of the circuit board probe fixture of FIG. 1.
Figure 4:
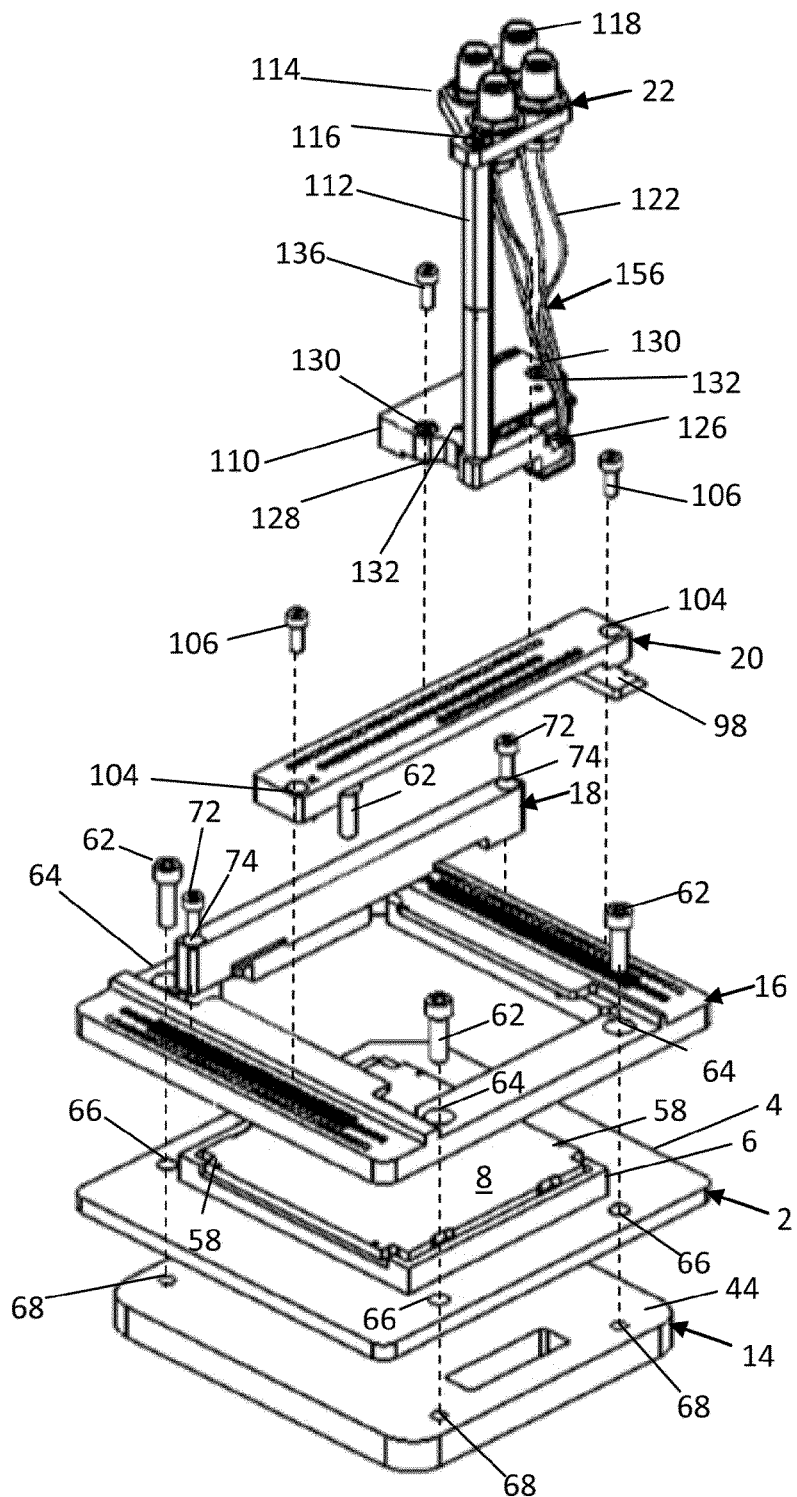
FIG. 4 is an exploded view of the circuit board probe fixture of FIG. 1.
Figure 5:
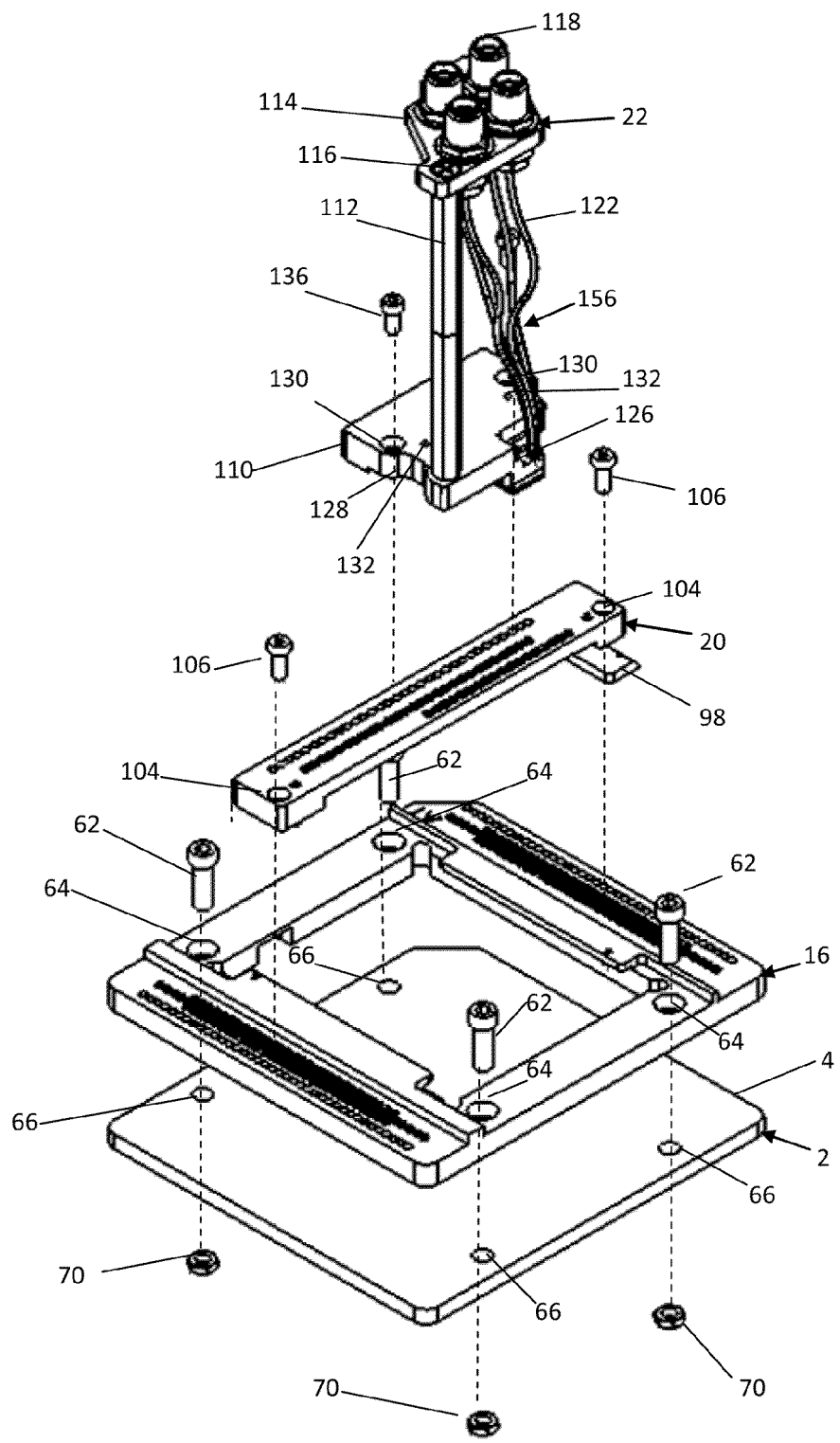
FIG. 5 is an exploded view of the circuit board probe fixture of FIG. 1 with a test unit without a socket.

In the configuration of FIGS. 7 and 8, the sides 50, 52 form a central opening 54 that fits around the area of the test unit 2 that can be probed. FIGS. 3 and 4 show a configuration wherein the central opening 54 is sized to fit around a socket 32 on the test unit 2. FIG. 5 shows a configuration for use with a test unit 12 without a socket.

Figure 2:
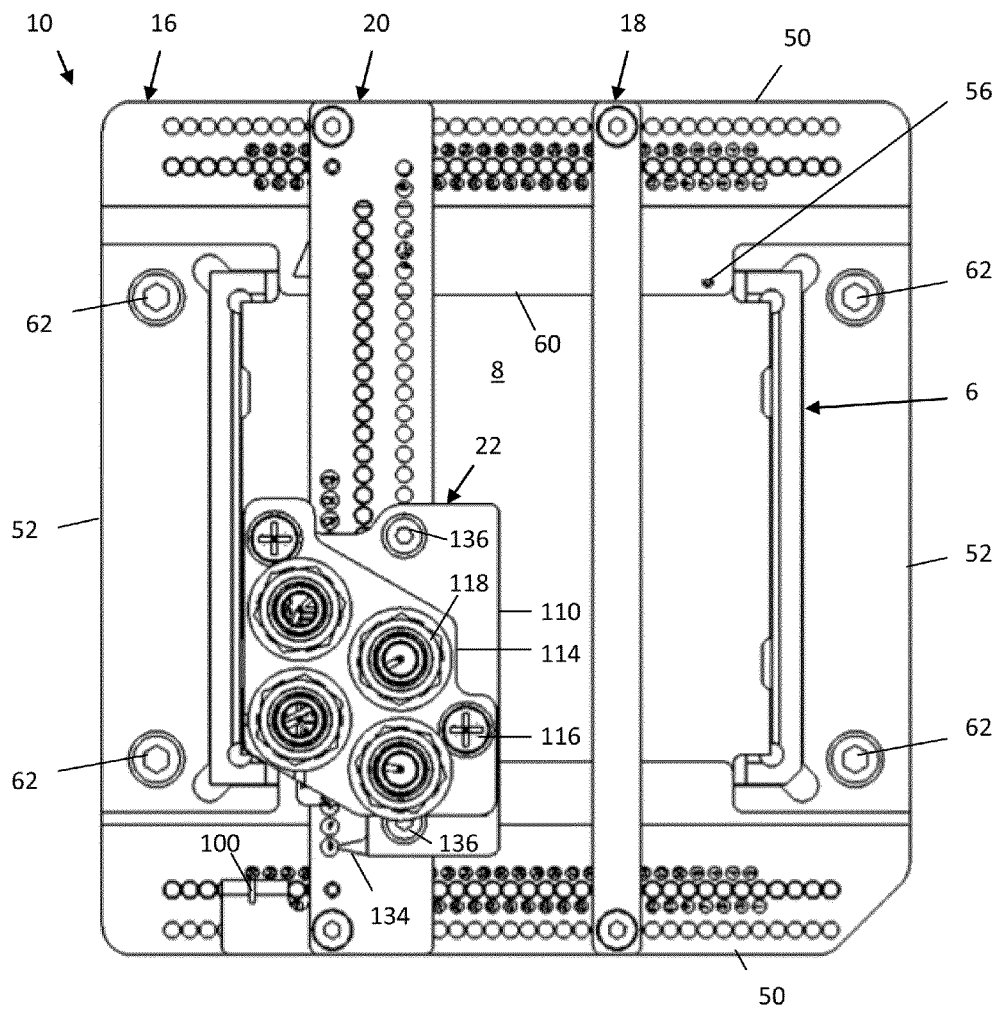
FIG. 2 is a top view of the circuit board probe fixture of FIG. 1.
Figure 20:
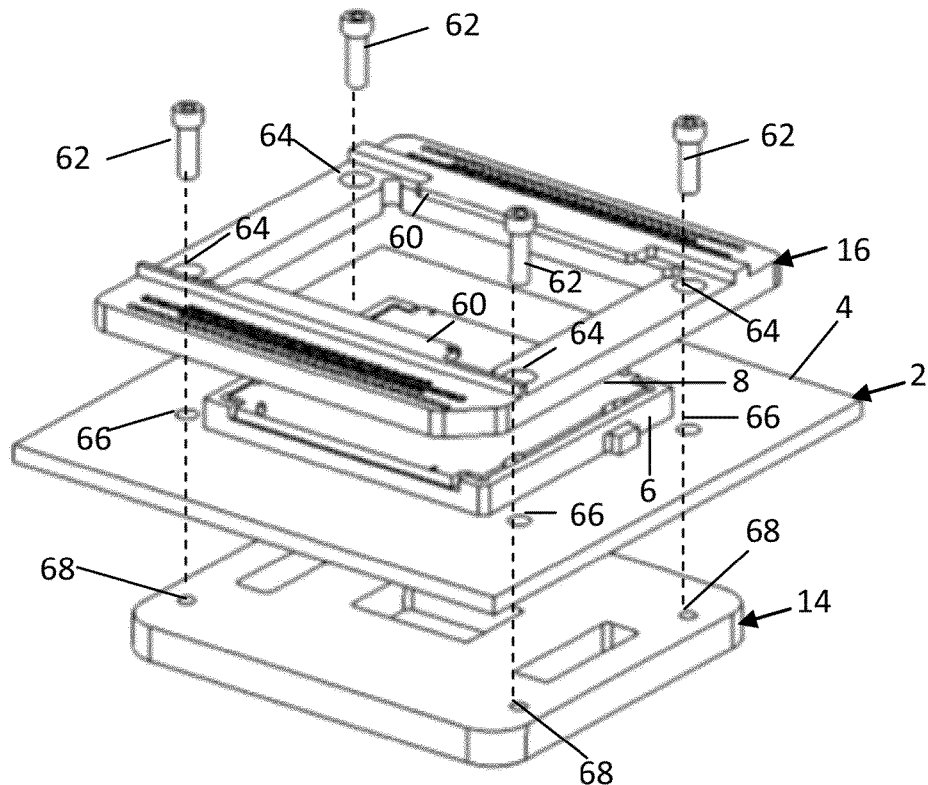
FIG. 20 shows the first step of the fixture assembly process wherein the guide plate and board stiffener are mounted to the test unit.
Figure 21:
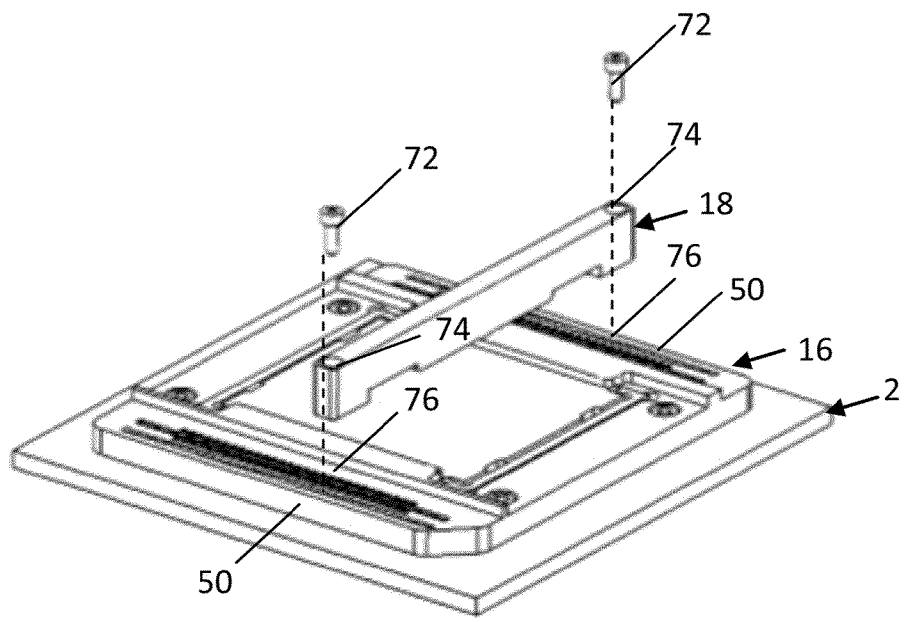
FIG. 21 shows the second step of the fixture assembly process wherein the optional retaining beam is mounted to the guide plate.

As shown in FIGS. 3 and 4, the guide plate 16 is placed on the test unit 2. Optional pins 56, shown in FIG. 7, extending downwardly from the guide plate 16 fit into holes 58 in the test unit 2 so that the guide plate 16 is aligned and oriented properly. Optional overhanging ledges 60, shown in FIG. 7, aid in retaining the contact extender 8 in the socket 32, as can be seen in FIGS. 1 and 2. The guide plate 16 is held by removable fasteners, typically screws 62 that fit through holes 64 in the mounting sides 52 of the guide plate 16, though holes 66 in the test unit 2, and that turn into threaded holes 68 in the board stiffener 14, as in FIGS. 4 and 20, or into nuts 70 under the test unit 2, as in FIGS. 5 and 6.

Figure 10:
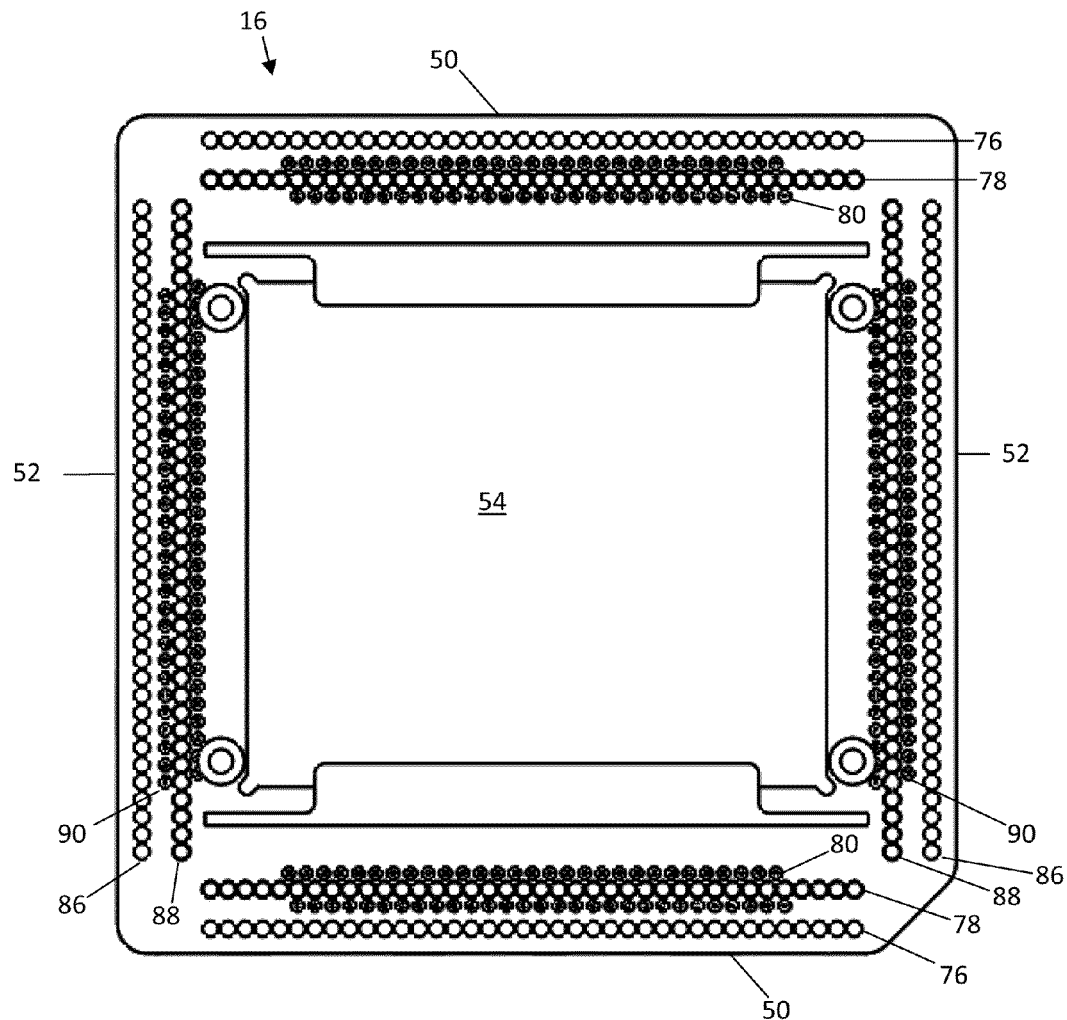
FIG. 10 is a top view of another configuration of the guide plate.

As shown in FIGS. 7-9, each of the indexing sides 50 has a line of column mounting holes 76, an optional line of column alignment holes 78 parallel to the column mounting holes 76, and column markings 80. Optionally, as shown in FIG. 10, each of the mounting sides 52 also has a line of column mounting holes 86, an optional line of column alignment holes 88 parallel to the column mounting holes 86, and column markings 90. How the holes 76, 78, 86, 88 and markings 80, 90 are used is described below.

The optional retaining beam 18 is used to retain the contact extender 8 in the socket 32. As shown in FIGS. 1-4, the retaining beam 18 is placed on the contact extender 8 so that it extends between and rests atop the indexing sides 50 of the guide plate 16. The retaining beam 18 is placed away from the area of the contact extender 8 that will be probed. The retaining beam 18 is mounted to the guide plate 16 by removable fasteners. Typically, a pair of screws 72 fit through holes 74 in the retaining beam 18 and turn into the threaded column mounting holes 76 in the indexing sides 50 that are aligned with the retaining beam holes 74. Optionally, the screws 72 are captive screws.

The bridge 20 provides the indexing necessary to correctly position the probe assembly 22 in the dimension orthogonal to that of the guide plate 16. Four different example bridges 20 are shown in FIGS. 11-14. The differences between these bridges 20 are explained below. A bridge 20 has a line of row mounting holes 92, an optional line of row alignment holes 94 parallel to the row mounting holes 92, row markings 96, a tab 98 with a column index pointer 100, one or more optional column alignment pins 102, and column mounting holes 104. The functions of these elements and how they are used are described below.

The probe assembly 22 provides the electrical signal connection to the test unit 2. The probe assembly 22 includes a base plate 110 with one or more posts 112 to a connector plate 114. Assembly screws 116 attach them together. External test signals and sensors connect to the test unit 2 through a cable assembly 156 on the probe assembly. Each cable assembly 156 includes an impedance-controlled connector 118 mounted in a hole 120 in the connector plate 114. An impedance-controlled cable 122 extends from the connector 118 to an impedance-controlled cable terminator 124 at a terminator platform 126 extending from the base plate 110. The base plate 110 has one or more optional row alignment pins 132 and a wide groove 128 in the bottom surface 138 that straddles the bridge 20. The functions of these elements and how they are used are described below.

Figure 15:
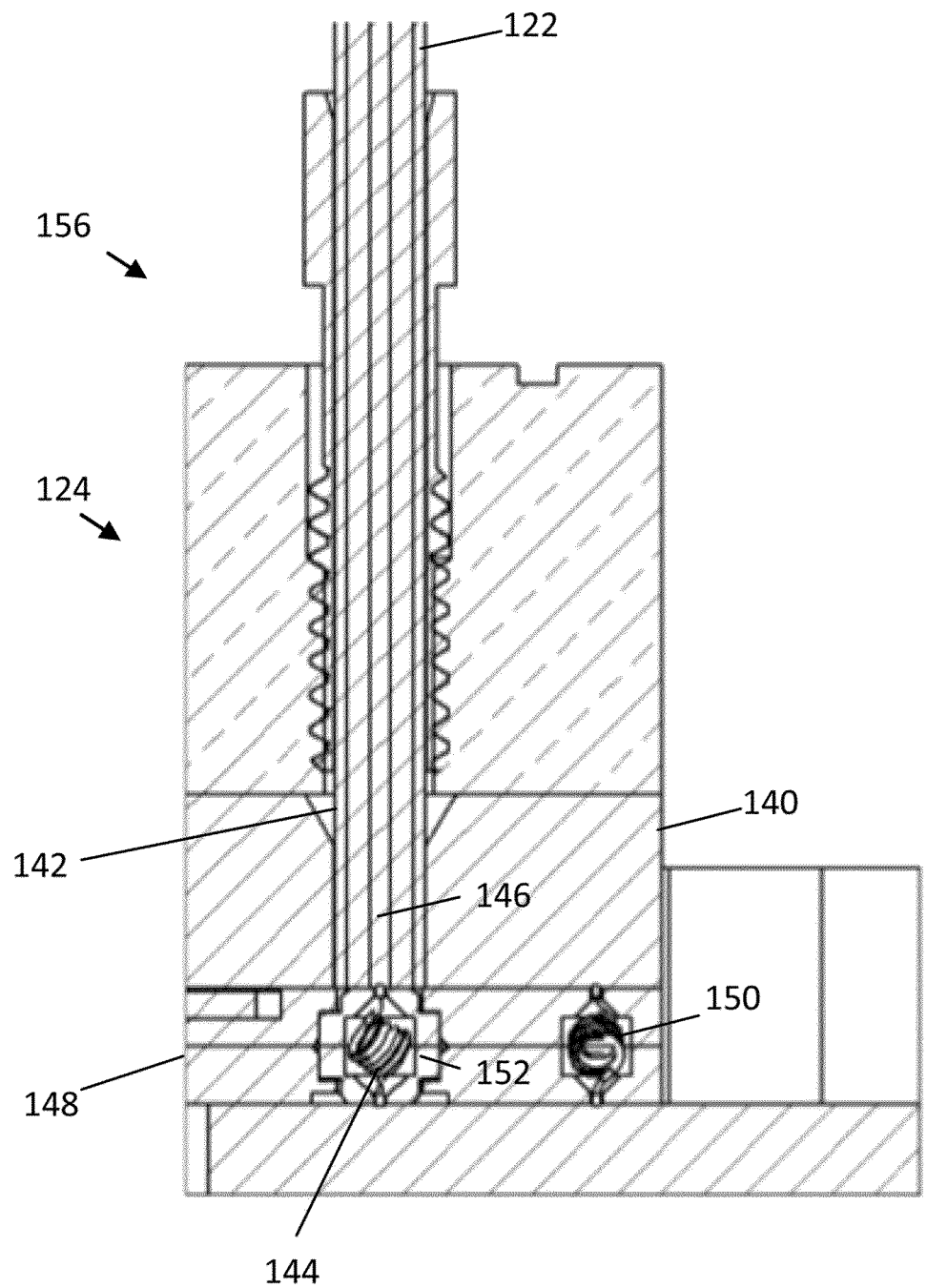
FIG. 15 is a detailed, cross-sectional view of a coaxial cable termination of FIG. 3 taken at A-A.

The various embodiments of the terminator 124 are described in detail in Patent Cooperation Treaty application No. PCT/US2012/061662, published as WO2013/063093, incorporated herein by reference. Briefly, as shown in FIG. 15, the terminator 124 includes a conductive ground block 140 for securing the cable 122 by its ground shield 142 and providing a common ground. Once the cable 122 is anchored in the ground block 140, the block face and cable ends are dressed to make a reliable electrical contact with the compliant signal contact 144 that electrically connects the cable signal conductor 146 to the device. An insulating or conductive plate 148 mounted to the ground block 140 holds the signal contact 144 and optional ground contacts 150 that electrically connect the ground block 140 to the ground plane of the test unit 2. The ground contacts 150 surround the signal contact 144 in a pattern that closely mimics the impedance environment of the cable 122. When using a conductive plate 148, the signal contact 144 is insulated from the plate 148 by an insulating centering plug 152 or a non-conductive coating.

The illustrated configuration of the probe assembly 22 has four cable assemblies 156. The present invention contemplates that there can be any number of cable assemblies 156 employing coaxial lines, tri-axial lines, and other forms of electrical signal transmission. Optionally, if there are two or more cable assemblies 156, they are phase-matched. In other words, the length of the cables 122 is such that the time all the signals take to travel from the connectors 118 to the test unit 2 is as close to the same within a specified tolerance and can be within picoseconds.

As described above, the terminator platform 126 extends from the probe base 110. The terminators 124 are arranged on the terminator platform 126 so that the signal contacts 144 and ground contacts 150 match the arrangement and pitch of the I/O grid of the test unit 2. The vertical position of the terminator platform 126 will depend on the topology of the test unit 2. For example, if the fixture 10 is only probing points on a contact extender 8, the terminator platform 126 will typically be higher than if the fixture is designed to probe points on the test unit board 4.

The fixture 10 is indexed in two dimensions, columns and rows, in the plane of the test unit 2. Columns are indexed by the column markings 80 on the indexing sides 50 of the guide plate 16 and rows are indexed by the row markings 96 on the bridge 20. In the present configuration, the column markings 80 are numbers and the row markings 96 are letter combinations and are taken directly from the test unit manufacturer's number and letter designations. In the present configuration, shown in FIG. 7-10, the column markings 80 are split among two offset lines of markings, an inner line 82 and an outer line 84. One reason is that the pitch of the grid is very fine and the markings need to be large enough to be legible. The present invention contemplates that the column markings 80 can be in one or more lines.

Figure 16:
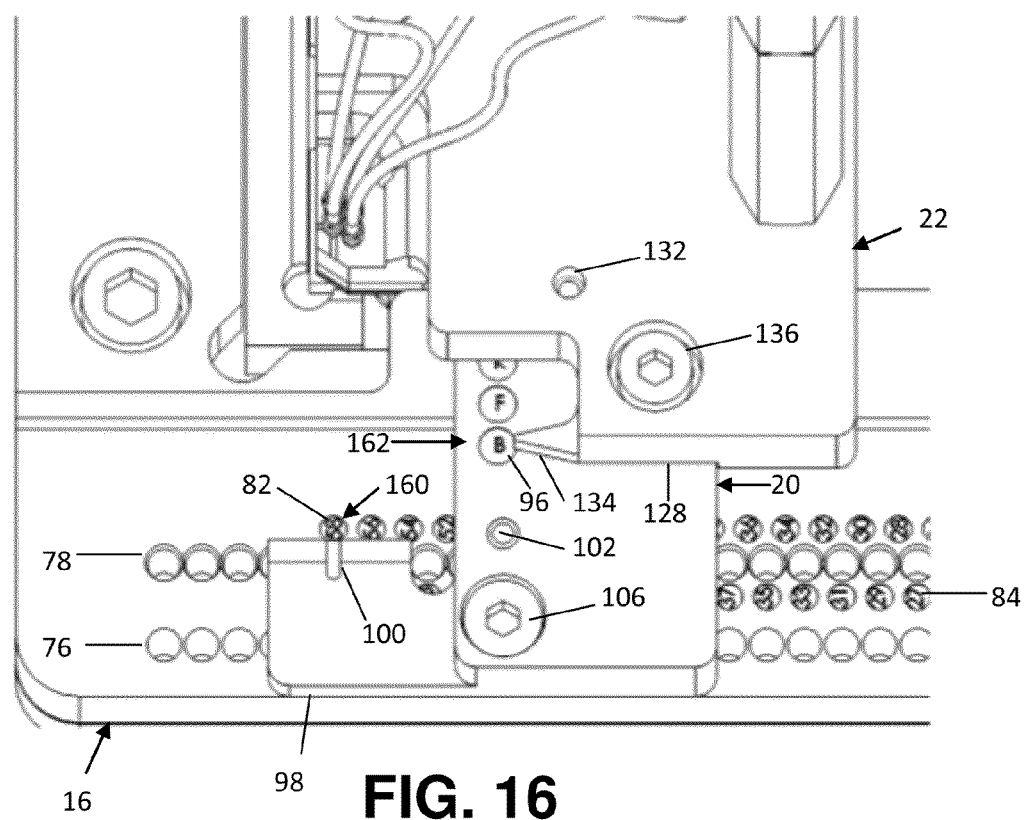
FIG. 16 shows the various indexing markings on the guide plate, bridge, and probe assembly.
Figure 22:
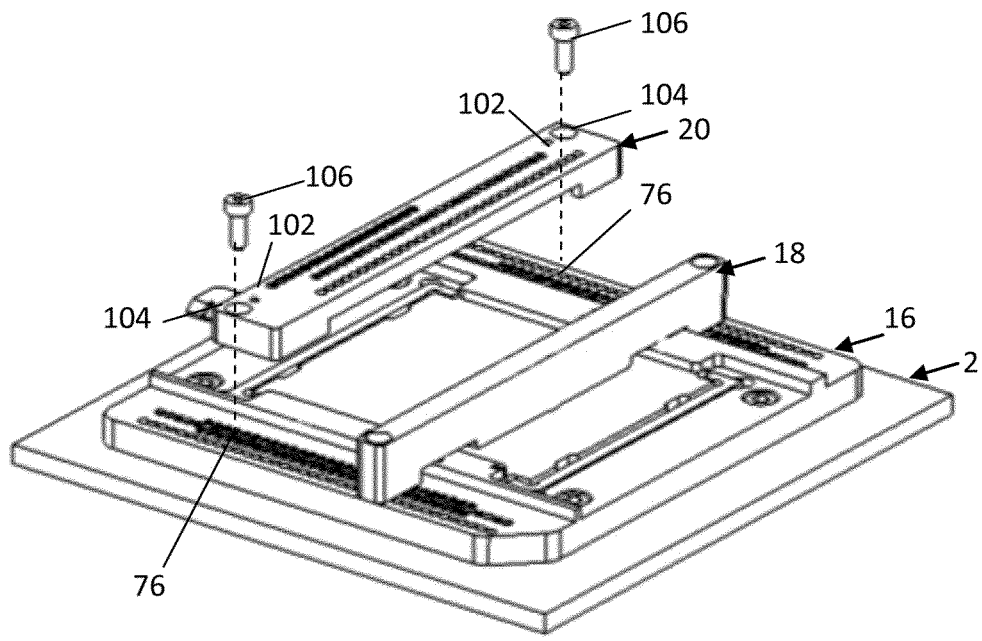
FIG. 22 shows the third step of the fixture assembly process wherein the bridge is mounted to the guide plate.

The bridge 20 is positioned on the guide plate 16 for the desired column as follows. The bridge 20 is held above the guide plate 16 such that it extends across the two indexing sides 50. The bridge 20 is moved along the indexing sides 50 until the column index pointer 100 on the column index pointer tab 98 is aligned with the desired column marking 80, as at 160 in FIG. 16. Then the bridge 20 is lowered to the guide plate 16 and mounted with removable fasteners. As shown in FIG. 22, the removable fasteners are typically screws 106 inserted into the mounting holes 104 and turned into the aligned column holes 76 in the guide plate 16. The optional column alignment pin(s) 102 fit into the appropriate optional column alignment holes 78 to maintain the position of the bridge 20 while installing the mounting screws 106.

Figure 11:
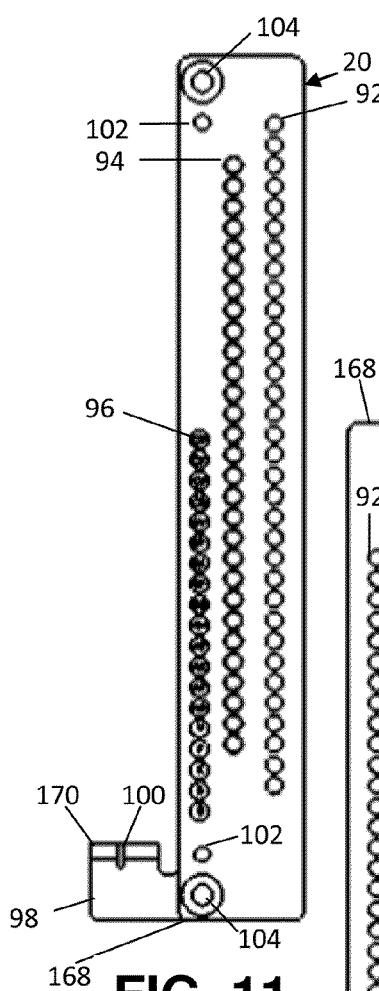
FIG. 11 is a top view of one configuration of the bridge.
Figure 12:
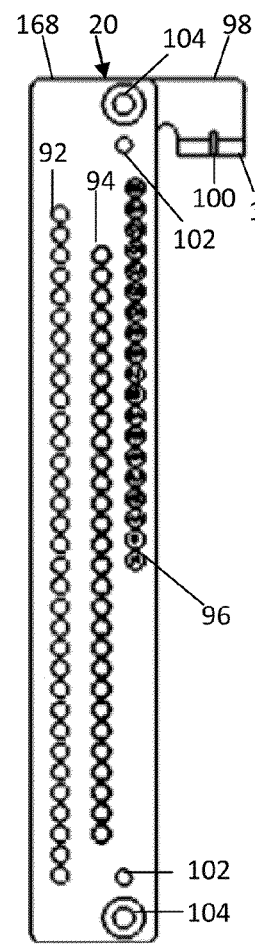
FIG. 12 is a top view of another configuration of the bridge.
Figure 13:
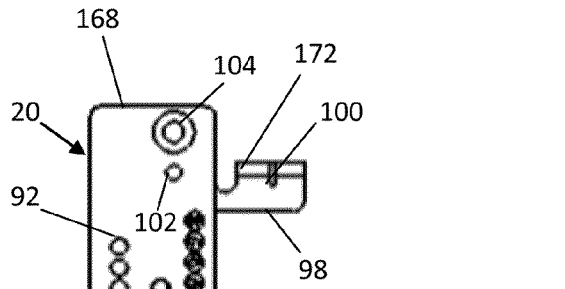
FIG. 13 is a top view of another configuration of the bridge.
Figure 14:
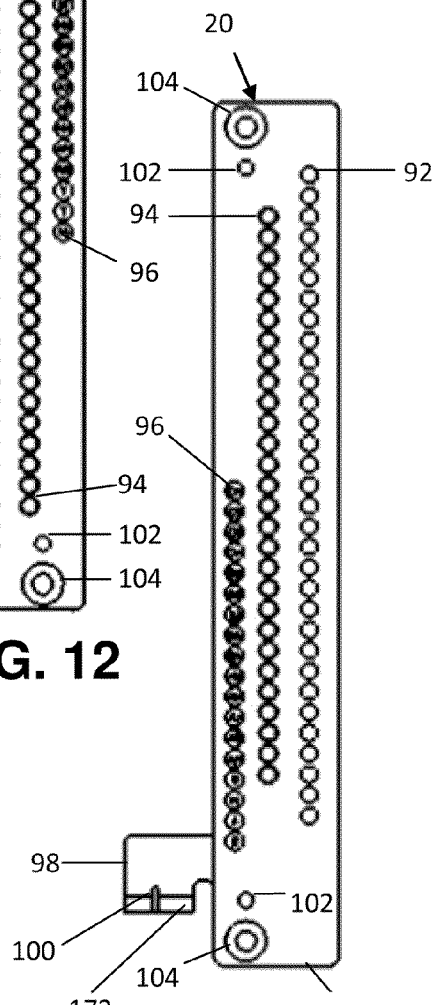
FIG. 14 is a top view of another configuration of the bridge.

For many test units 2, not all columns and rows can be reached using a single bridge 20. In such a case, a set of bridges 20 is needed to reach all columns and rows. An example of a set of bridges 20 is shown in FIGS. 11-14. Note that, in the bridges 20 of FIGS. 11 and 13, the column index pointer tab 98 is at the end 168 of the bridge 20 and the pointer 100 is on the inner edge 170, pointing to the inner column marking line 82. FIGS. 11 and 13 differ in the row markings 96. Also note that, in the bridges 20 of FIGS. 12 and 14, the column index pointer tab 98 is spaced from the end 168 of the bridge 20 and the pointer 100 is on the outer edge 172, pointing to the outer column marking line 84. The pointer 100 points to different column index markings 80 on the guide plate 16. FIGS. 12 and 14 differ in the row markings 96.

Optionally, as described above, the mounting sides 52 of the guide plate 16 also have column mounting holes 86, optional column alignment holes 88, and column markings 90. These are used in the same way as the column mounting holes 76, optional column alignment holes 78, and column markings 80 on the indexing sides 50 when the bridge 20 is rotated 90°.

Figure 23:
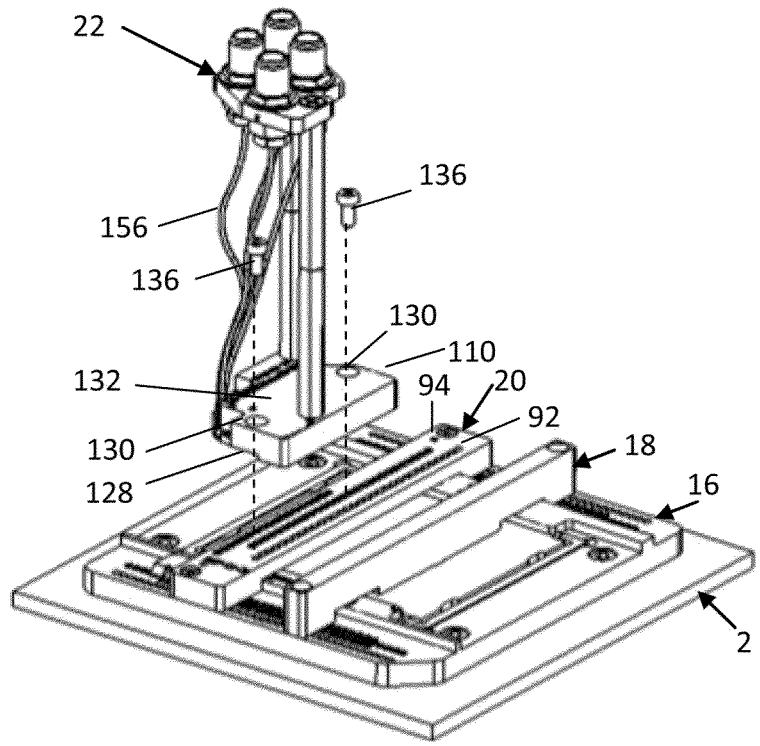
FIG. 23 shows the fourth step of the fixture assembly process wherein the probe assembly is mounted to the bridge.

The probe assembly 22 is positioned on the bridge 20 for the desired row. The probe assembly 22 is held above the bridge 20 with the groove 128 aligned with the bridge 20. Then the probe assembly 22 is moved along the bridge 20 until the row index pointer 134 extending from the base plate 110 is aligned with the desired row marking 96, as at 162 in FIG. 16. Then the probe assembly 22 is lowered to the bridge 20 and mounted to the bridge 20 by removable fasteners. Typically, the removable fasteners are screws 136 inserted into the mounting holes 130 and turned into the aligned row mounting holes 92 in the bridge 20, as shown in FIG. 23. The optional row alignment pin(s) 132 fit into the optional row alignment holes 94 to maintain the position of the probe assembly while installing the mounting screws 136.

Figure 17:
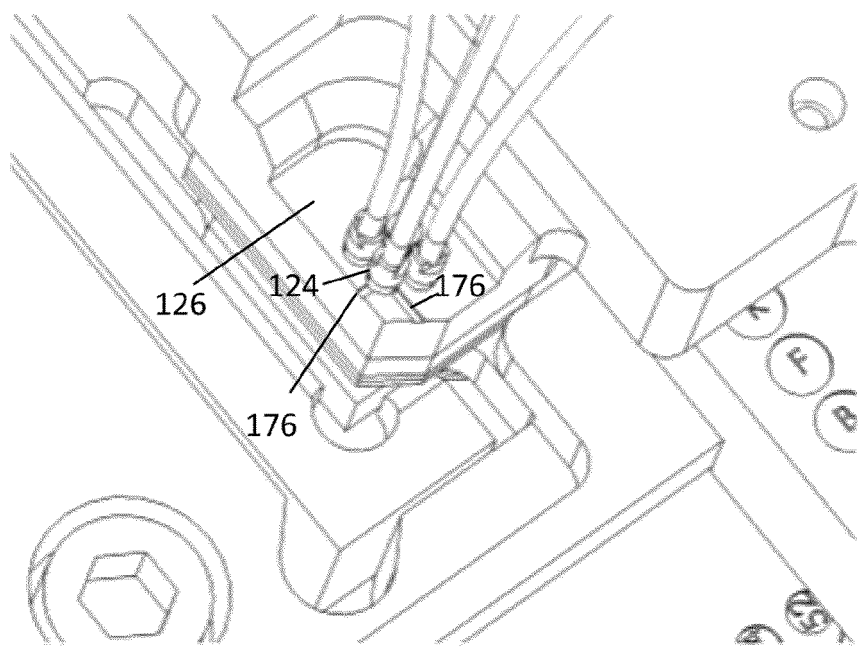
FIG. 17 shows the index markings on the terminator platform.
Figure 18:
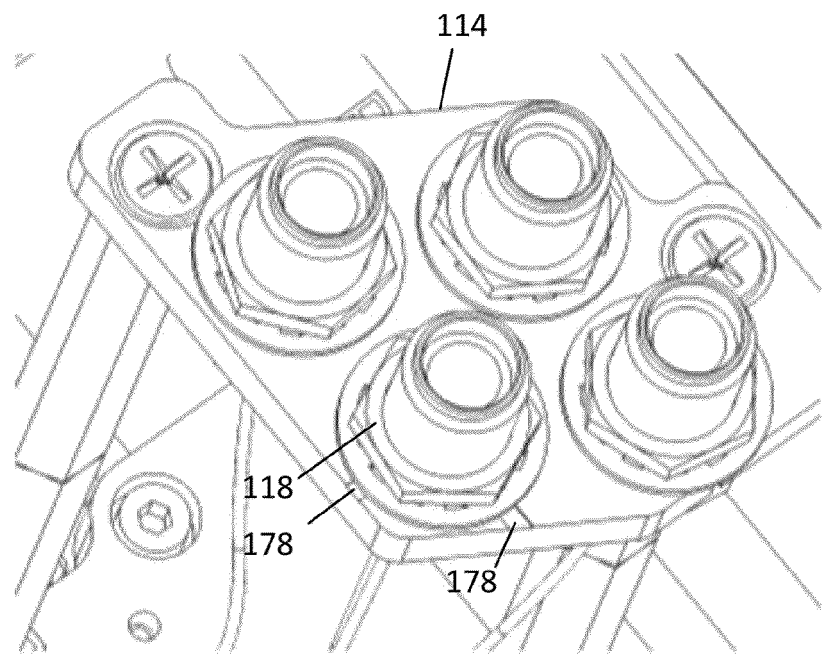
FIG. 18 shows the index markings on the probe connector plate.

The particular terminator 124 corresponding to the selected column and row is shown by index markings. Referring to FIG. 17, the terminator platform 126 has indexing marks 176 that indicate the terminator 124 corresponding to the selected column and row. Referring to FIG. 18, the probe connector plate 114 has indexing marks 178 that indicate the connector 118 that corresponds to the indexed terminator 124.

Figure 6:
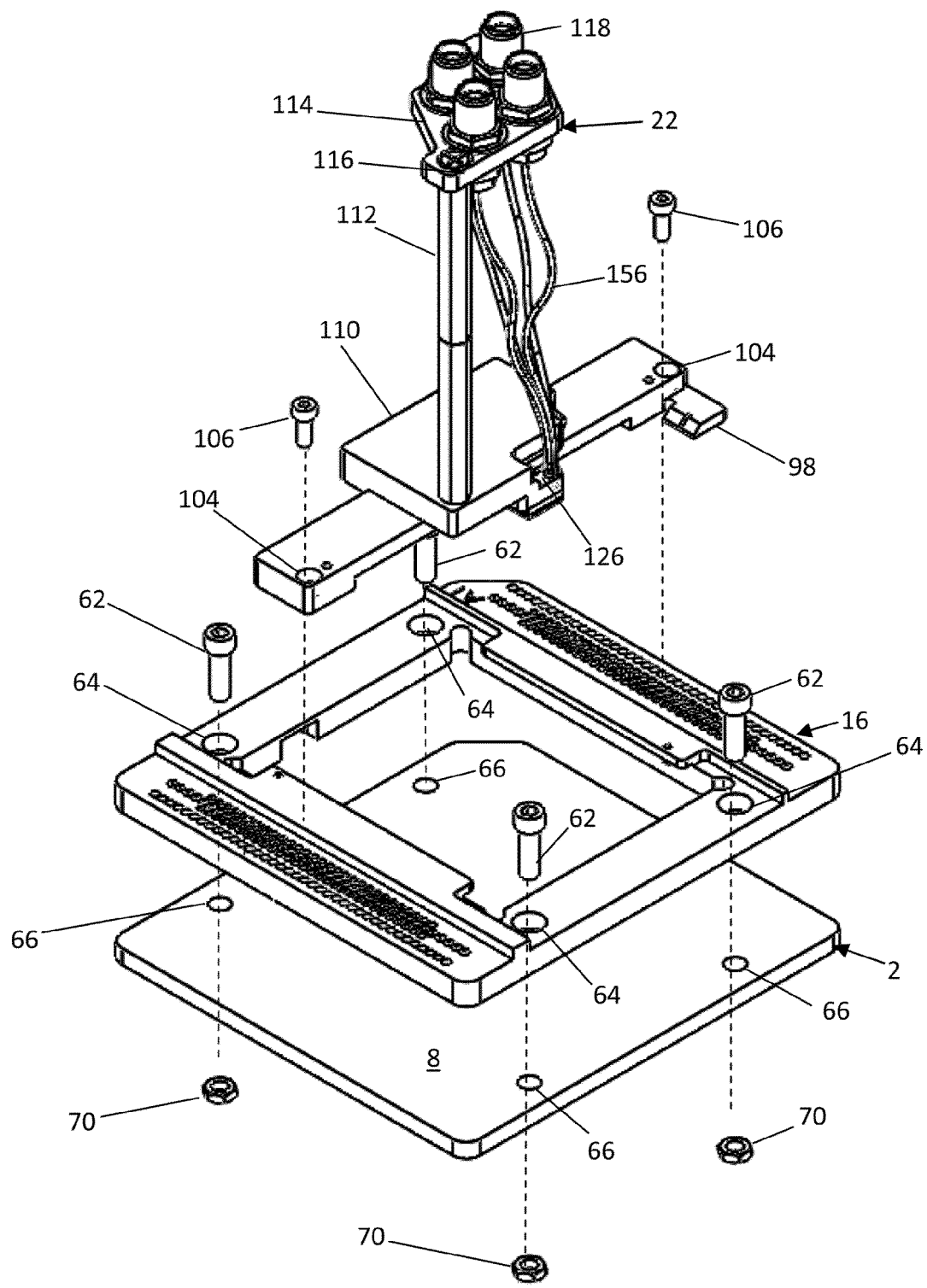
FIG. 6 is an exploded view of the circuit board probe fixture of FIG. 1 without a separate bridge.

Optionally, the probe assembly 22 is designed so that the probe assembly 22 incorporates a bridge that extends across the indexing sides 50, as in FIG. 6. Such a design is useful if, for example, all of the test points on the test unit 2 are in a single line. Such a probe assembly 22 is aligned and mounted in the same way that the bridge 20 is aligned and mounted.

Figure 19:
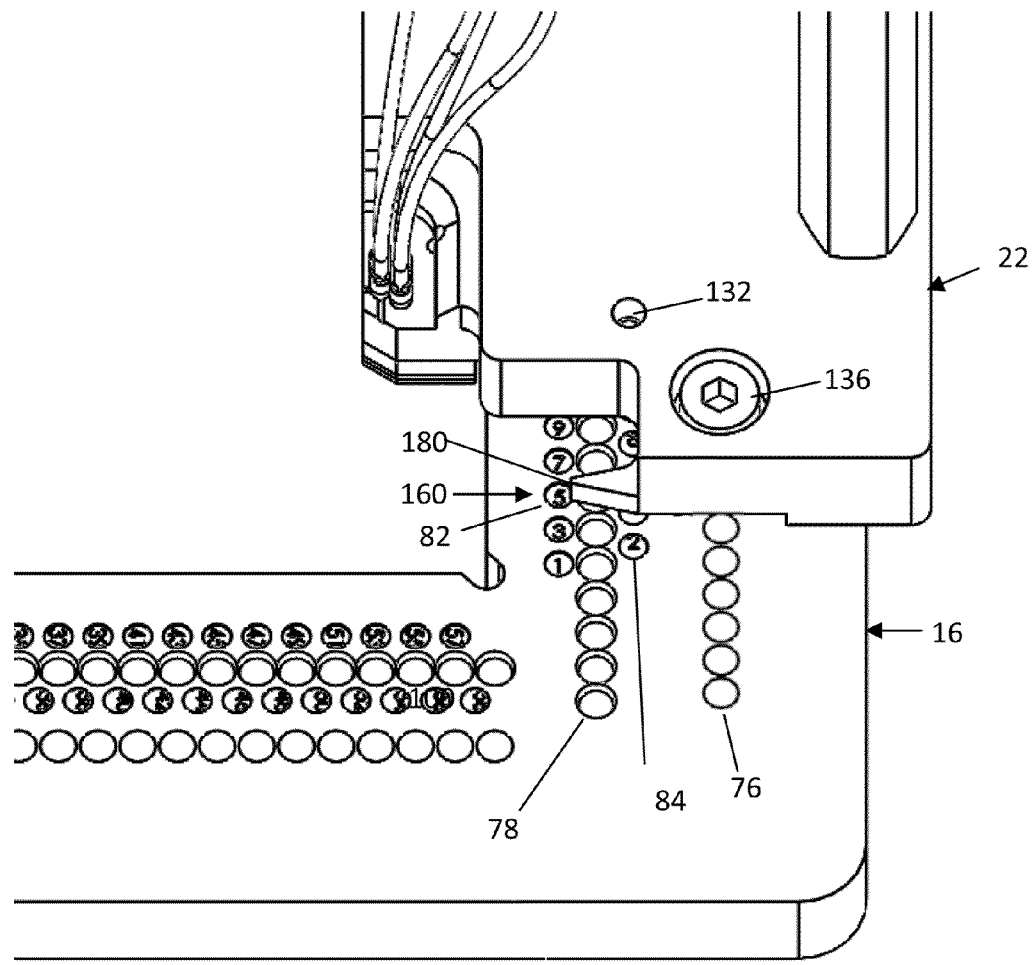
FIG. 19 shows the index markings on the guide plate and probe assembly without a bridge.

Optionally, as shown in FIG. 19, the probe assembly 22 is designed so that the probe assembly 22 incorporates a bridge that can be mounted directly to the guide plate 16. Such a design can be used if, for example, all of the test points on the test unit 2 are around the perimeter of the opening 54 using the guide plates 16 of FIGS. 7, 8, and 10, or in a line in the center of the test unit using the guide plate 16 of FIG. 9. The probe assembly 22 is positioned on the desired guide plate side 50, 52. The probe assembly 22 is moved along the guide plate side 50, 52 until the index pointer 180 on the probe assembly 22 is aligned with the column marking 160 on the guide plate 16. Then the probe assembly 22 is lowered to the guide plate 16 and mounted to the appropriate guide plate column mounting holes 76 by removable fasteners.

Although the screws 62, 72, 106, 136 used to assemble the fixture 10 are shown in the figures as having hex (Allen) socket heads, the present invention contemplates that the screws can be of any type including, for example, Phillips-head screws and finger-tighten screws. Alternatively, a cam, lever, and spring mechanism can be used to assemble fixture 10.

Thus it has been shown and described a circuit board probe fixture. Since certain changes may be made in the present disclosure without departing from the scope of the present invention, it is intended that all matter described in the foregoing specification and shown in the accompanying drawings be interpreted as illustrative and not in a limiting sense.

What is claimed is:

1. A circuit board probe fixture for a generally planar test unit, the fixture comprising:
   (a) a guide plate adapted to be mounted to the test unit, the guide plate having a pair of opposed mounting sides connected by at least one indexing side, all of the at least one indexing side having a line of column mounting holes and column markings;
   (b) a probe assembly having a base plate with a bridge mounted to the guide plate by column removable fasteners in the column mounting holes, the bridge having a column pointer aligned with the column marking on the guide plate corresponding to a desired location on the test unit, the probe assembly having a connector plate attached to the base plate by one or more posts, a terminator platform extending from the base plate, at least one cable assembly including an electrical connector mounted to the connector plate and an electrical cable extending from the connector to a cable terminator at the terminator platform, the cable terminator having at least a signal contact and a ground contact adapted to make electrical contact with the test unit.

2. The circuit board probe fixture of claim 1 wherein the at least one indexing side is two indexing sides.

3. The circuit board probe fixture of claim 2 wherein both indexing sides have a line of column alignment holes parallel to the column mounting holes and at least one column alignment pin on the bridge.

4. The circuit board probe fixture of claim 2 wherein the two indexing sides are parallel to each other.

5. The circuit board probe fixture of claim 2 wherein the bridge extends across the opening between the two indexing sides.

6. The circuit board probe fixture of claim 5 wherein the bridge has a line of row mounting holes and a line of row markings, the base plate is mounted to the bridge by row removable fasteners in the row mounting holes, and the base plate has a row pointer aligned with the row marking on the bridge corresponding to a desired location on the test unit.

7. The circuit board probe fixture of claim 6 wherein the bridge has a line of row alignment holes parallel to the row mounting holes and at least one row alignment pin on the base plate.

8. The circuit board probe fixture of claim 6 wherein all of the at least one indexing side has a line of column alignment holes parallel to the column mounting holes and at least one column alignment pin on the bridge and the bridge has a line of row alignment holes parallel to the row mounting holes and at least one row alignment pin on the base plate.

9. The circuit board probe fixture of claim 6 wherein the column removable fasteners and the row removable fasteners are screws.

10. The circuit board probe fixture of claim 1 wherein all of the at least one indexing side has a line of column alignment holes parallel to the column mounting holes and at least one column alignment pin on the bridge.

11. The circuit board probe fixture of claim 1 further comprising a board stiffener adapted to be mounted to the test unit.

12. The circuit board probe fixture of claim 1 wherein each mounting side has a line of column mounting holes and column markings.

13. The circuit board probe fixture of claim 1 wherein the column removable fasteners are screws.

14. The circuit board probe fixture of claim 1 wherein the at least one cable assembly is a plurality of cable assemblies and wherein at least two of the cable assemblies are phase-matched.

* * * * *